United States Patent
Kim et al.

(10) Patent No.: US 10,770,329 B2
(45) Date of Patent: *Sep. 8, 2020

(54) GAS FLOW FOR CONDENSATION REDUCTION WITH A SUBSTRATE PROCESSING CHUCK

(71) Applicant: Applied Materials, Inc., Santa Clara, CA (US)

(72) Inventors: Hun Sang Kim, San Ramon, CA (US); Michael D. Willwerth, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

This patent is subject to a terminal disclaimer.

(21) Appl. No.: 16/213,594

(22) Filed: Dec. 7, 2018

(65) Prior Publication Data

US 2019/0115240 A1 Apr. 18, 2019

Related U.S. Application Data

(63) Continuation of application No. 14/663,913, filed on Mar. 20, 2015, now Pat. No. 10,186,444.

(51) Int. Cl.
*H01L 21/683* (2006.01)
*H01J 37/32* (2006.01)
(Continued)

(52) U.S. Cl.
CPC ........ *H01L 21/6831* (2013.01); *C23C 16/458* (2013.01); *H01J 37/32715* (2013.01); *H01L 21/67109* (2013.01)

(58) Field of Classification Search
CPC ........... H01L 21/6831; H01L 21/67109; H01L 21/67017; C23C 16/458; H01J 37/32715
See application file for complete search history.

(56) References Cited

U.S. PATENT DOCUMENTS 6,129,046 A * 10/2000 Mizuno ............. C23C 16/45521
118/725
6,740,853 B1 * 5/2004 Johnson ............... C23C 16/4586
118/620
(Continued)

FOREIGN PATENT DOCUMENTS

JP 2003-321774 11/2003
JP 2007-317772 12/2007
(Continued)

OTHER PUBLICATIONS

Official Letter for Taiwan Patent Application No. 105101392, dated Apr. 22, 2019, 7 pgs.—including partial translation of the Official Letter.
(Continued)

*Primary Examiner* — Rakesh K Dhingra
*Assistant Examiner* — Laureen Chan
(74) *Attorney, Agent, or Firm* — Schwabe, Williamson & Wyatt, P.C.

(57) ABSTRACT

A gas flow is described to reduce condensation with a substrate processing chuck. In one example, a workpiece holder in the chamber having a puck to carry the workpiece for fabrication processes, a top plate thermally coupled to the puck, a cooling plate fastened to and thermally coupled to the top plate, the cooling plate having a cooling channel to carry a heat transfer fluid to transfer heat from the cooling plate, a base plate fastened to the cooling plate opposite the puck, and a dry gas inlet of the base plate to supply a dry gas under pressure to a space between the base plate and the cooling plate to drive ambient air from between the base plate and the cooling plate.

13 Claims, 5 Drawing Sheets

(51) Int. Cl.
*C23C 16/458* (2006.01)
*H01L 21/67* (2006.01)

(56) References Cited

U.S. PATENT DOCUMENTS

| | | | | |
|---|---|---|---|---|
| 2004/0144322 | A1* | 7/2004 | Kuibira | C23C 16/45521 118/728 |
| 2005/0068736 | A1* | 3/2005 | Moroz | H01L 21/67109 361/704 |
| 2006/0002053 | A1* | 1/2006 | Brown | H01L 21/6831 361/234 |
| 2009/0097184 | A1* | 4/2009 | Buchberger, Jr. | H01L 21/67109 361/234 |
| 2010/0039747 | A1* | 2/2010 | Sansoni | H01L 21/6831 361/234 |
| 2010/0187447 | A1* | 7/2010 | Lee | H01L 21/67109 250/492.21 |
| 2011/0005686 | A1* | 1/2011 | Tanaka | H01L 21/68792 156/345.52 |
| 2012/0091104 | A1* | 4/2012 | Tavassoli | B23B 31/28 219/121.4 |
| 2012/0285619 | A1* | 11/2012 | Matyushkin | H01L 21/6875 156/345.1 |
| 2012/0328797 | A1 | 12/2012 | Maass et al. | |
| 2013/0001899 | A1* | 1/2013 | Hwang | H01L 21/68785 279/128 |
| 2014/0101964 | A1* | 4/2014 | Sirard | H01L 21/67034 34/284 |

FOREIGN PATENT DOCUMENTS

JP 2007-317772 6/2009
WO WO 2013/162937 10/2013

OTHER PUBLICATIONS

International Search Report and Written Opinion from PCT/US2016/013484 dated Apr. 25, 2016, 8 pgs.
International Preliminary Report on Patentability from PCT/US2016/013484 dated Oct. 5, 2017, 7 pgs.
Non-Final Office Action from U.S. Appl. No. 14/663,913 dated Jun. 8, 2017, 29 pgs.
Final Office Action from U.S. Appl. No. 14/663,913 dated Nov. 28, 2017, 39 pgs.
Notice of Reasons for Rejection from Japanese Patent Application No. 2017-544315 dated Dec. 10, 2019, 11 pgs.

* cited by examiner

GAS FLOW FOR CONDENSATION REDUCTION WITH A SUBSTRATE PROCESSING CHUCK

CROSS-REFERENCE TO RELATED APPLICATIONS

This application is a continuation of U.S. patent application Ser. No. 14/663,913, filed on Mar. 20, 2015, the entire contents of which are hereby incorporated by reference herein.

TECHNICAL FIELD

Embodiments of the present invention relate to the microelectronics manufacturing industry and more particularly to temperature controlled chucks for supporting a workpiece during plasma processing.

BACKGROUND

In the manufacture of semiconductor chips a silicon wafer or other substrate is exposed to a variety of different processes in different processing chambers. The chambers may expose the wafer to plasmas, chemical vapors, metals, laser etching, and various deposition and acid etching processes in order to form circuitry and other structures on the wafer. During these processes, the silicon wafer may be held in place by a vacuum chuck or an electrostatic chuck (ESC). The chuck holds the wafer by generating an electrostatic field to clamp the back side of the wafer to a flat surface or puck surface of the chuck.

As fabrication techniques for plasma processing equipment advance, such as those designed to perform plasma etching of microelectronic devices and the like, the temperature of the wafer during processing becomes more important. Liquid cooling is sometimes used to absorb the plasma power heat and remove it from the chuck. In some cases, other processes are performed at much lower temperatures than a typical plasma process. A chuck that operates under a wide range of temperatures allows different processes to be performed without moving the wafer to a different holder. This allows for reduced costs for the fabrication as a whole.

For lower temperature processing operations, condensation may occur on the processing equipment. When it occurs on a wafer or other substrate holder, such as a pedestal, carrier, or chuck, condensation can impair the operation of the holder. It can also reduce the operational lifespan of the holder.

SUMMARY

A gas flow is described to reduce condensation with a substrate processing chuck. In one example, a workpiece holder in the chamber having a puck to carry the workpiece for fabrication processes, a top plate thermally coupled to the puck, a cooling plate fastened to and thermally coupled to the top plate, the cooling plate having a cooling channel to carry a heat transfer fluid to transfer heat from the cooling plate, a base plate fastened to the cooling plate opposite the puck, and a dry gas outlet of the base plate to supply a dry gas under pressure to a space between the base plate and the cooling plate to drive ambient air from between the base plate and the cooling plate.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

In the production of semiconductor, micromachine and other components, using a processing chamber, some of the processes are performed at high temperature and others are performed at low temperature. Some of the processes may be performed at high pressure or at low pressure or vacuum pressure. During cooler processes ambient air may be carried into the chuck or pedestal and then condense on surfaces of the equipment. As described herein a dry gas such as nitrogen may be used to purge out the ambient air and its moisture. The dry gas may be driven into the chuck or pedestal under modest pressure to slowly drive out the ambient air. This gas will be referred to herein as a dry gas or a purge gas and may be $N_2$ gas or any other gas suitable for removing any undesired type of moisture from internal surfaces of the workpiece support.

The flow of the purge gas may be controlled by providing dedicated gas inlets to the interior of the chuck. Once conducted into the chuck the purge gas may be allowed to permeate any opening and push any moisture out of the chuck through small gaps and spaces in the chuck. Breather tubes may be used to allow the purge gas to push the moist air out of the chuck.

Gas flow may be further guided within the chuck by forming channels in the surface of one of the chuck components, the channels may be used to guide the gas or to increase flow in one or more directions. For a chuck made from multiple plates, the channels may be in the form of grooves on a surface of one of the plates.

Figure 1:
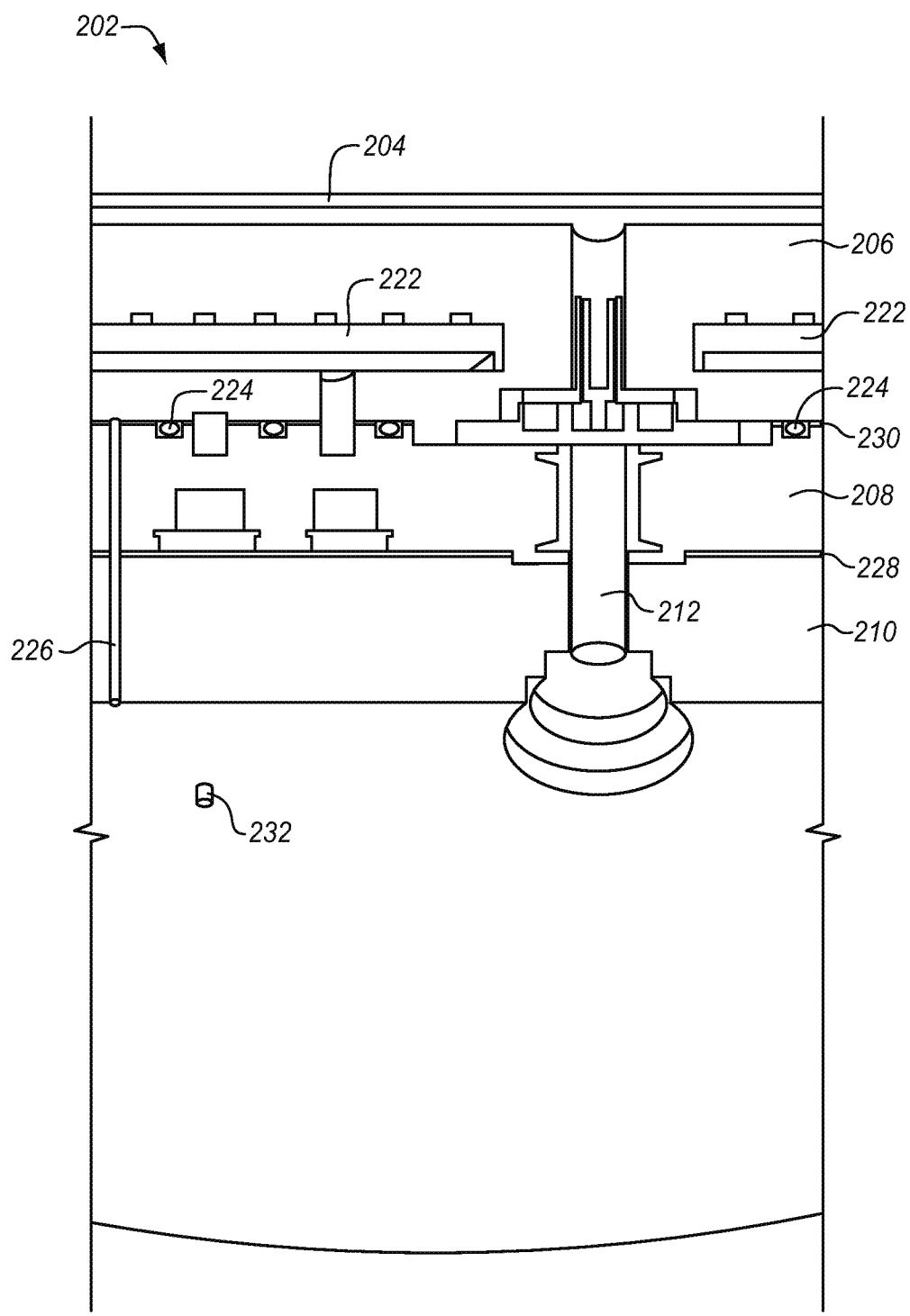
FIG. 1 is an isometric and cross-sectional view of a portion of an electrostatic chuck for supporting a wafer in accordance with an embodiment of the invention.
Figure 6:
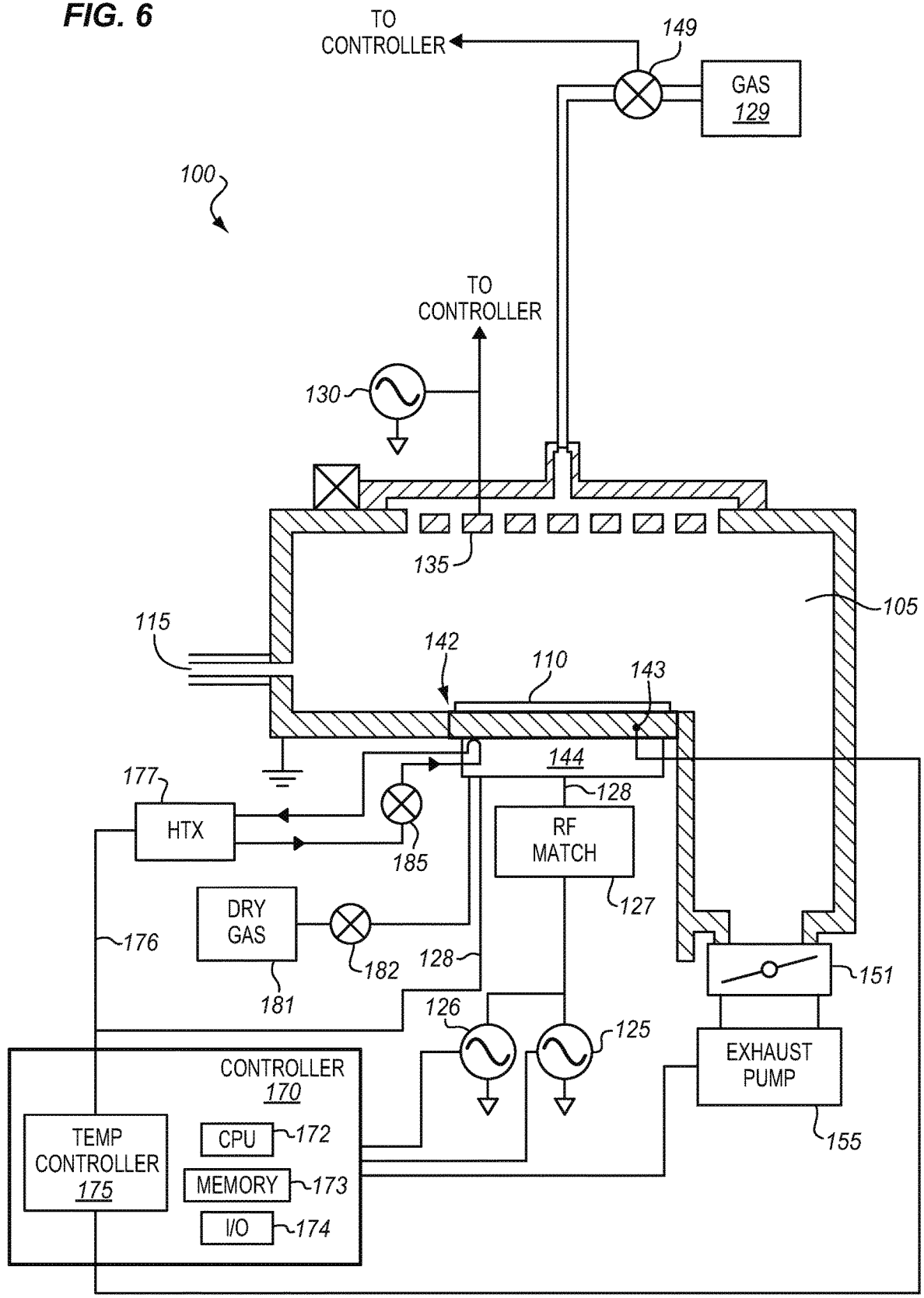
FIG. 6 is a schematic of a plasma etch system including a chuck assembly in accordance with an embodiment of the present invention.

FIG. 1 is an isometric and cross-sectional view of a portion of an electrostatic chuck 202 for supporting a wafer for processing in a chamber such as, for example, the chamber of FIG. 6. A dielectric puck 204 is at the top of the chuck to carry the wafer. The dielectric puck is supported by a top plate 206 which, in turn, is supported by a cooling plate 208 which is carried by a base plate 210. The cooling plate is fastened to and thermally coupled to the top plate. The base plate is fastened to the cooling plate opposite the puck. The base plate is carried by a shaft 212. The chuck may be a vacuum chuck, pedestal, carrier, ESC, or similar type device.

The shaft and the base plate may be constructed of a variety of different rigid, dielectric and thermally insulating materials including a thermoset polystyrene such as Rexolite®. Alternatively, the shaft and the base plate may be constructed of ceramics, Inconel®, aluminum oxides and a variety of other materials. While the present invention will be described in the context of a vacuum chuck 202, alternatively, the chuck may use any of a variety of other techniques to hold the wafer against the dielectric puck 204 including electromagnetic force, electrostatic force, vacuum, and an adhesive.

The cooling plate has one or more cooling channels to carry a coolant through the coolant plate 208. The coolant is supplied through the shaft 212 and pumped from the shaft to heat exchangers 177 to control the temperature of the coolant before it is pumped back into the chuck 202. The coolant plate is sealed against the top plate 206 by O-rings 224.

The top plate optionally carries resistive heaters (not shown). These may be attached to the top surface of the top plate or built into the structure of the top plate. The heaters are power by a current supply through the shaft 212. In operation, the top plate heaters provide heat to the puck 204 while the cooling plate removes heat. This prevents any accumulation of heat so that the temperature may be reduced simply by reducing the drive current for a heater. The combined effect of the cooling channel and the heater is to provide precise control by the temperature controller over the wafer temperature.

In some embodiments, the heaters are resistive heaters which generate heat in response to an applied current. The chuck also includes a temperature sensor 143, such as a thermocouple, to sense the heat of the upper plate of or of the dielectric puck. The heater is coupled through a wire conduit which leads through to the shaft 212 to receive a heating current from an external controller such as the temperature controller 175 of FIG. 1. Alternatively, no heaters are provided and the wafer is heated by conditions applied to it within a processing chamber.

The base plate and the cooling plate have cylindrical bores 226 that extend from the bottom of the base plate to the top of the cooling plate and therefore to the space between the cooling plate and the top plate 206. The cylindrical bores serve as breather tubes to allow air to flow between the base plate and the cooling plate and between the cooling plate and the top plate. The breather tubes allow the interior of the chuck to adapt to changes in the ambient air pressure. This allows the chuck to remain stable in vacuum chambers and high pressure chambers for different types of fabrication processes.

As shown there is a small gap 228 between the base plate and the cooling plate. There is a similar small gap 230 between the cooling plate and the top plate. While there are O-rings 224 in various locations, these are intended to seal off specific channels and not to seal the entire gap between the surfaces. The gaps 228, 230 are open to the ambient air through the breather tubes 226 and to the shaft 212. In one embodiment, the shaft 212 is a central shaft. The breather tubes and the central shaft allow ambient air to enter and leave the small gaps. This allows pressure to be equalized inside and outside the chuck. Because fabrication processes may present extreme ambient air pressure differences, the open interior improves the reliability of the chuck.

In cooler processes, the ambient air may contain water moisture and other contaminants. This moisture is carried by the ambient air and is allowed to enter the small gaps between the plates and other open spaces within the chuck. Under some conditions, such as thermal and electrostatic cycling, the moisture condenses on interior surfaces of the chuck. After it is deposited on these surfaces, it may corrode, wear, or otherwise degrade these interior surfaces. In addition, for water condensation and condensation of other material, the deposited water or other materials may interact with electromagnetic fields in the processing chamber, such as plasma and ion fields to interfere with the fabrication processes being performed in the chamber.

While it is possible to seal these areas from ambient air entry, this allows a pressure differential to stress the chuck and may damage or reduce the service life of the chuck. Instead of sealing these areas, a dry gas such as nitrogen is pumped into these areas to flush out the areas and remove any moisture. One or more input connectors 232 are provided on the base plate to connect a source of dry gas. The input connector is coupled to a bore through the base plate to feed the dry gas into the small gap 228 between the base plate and the cooling plate.

Figure 2:
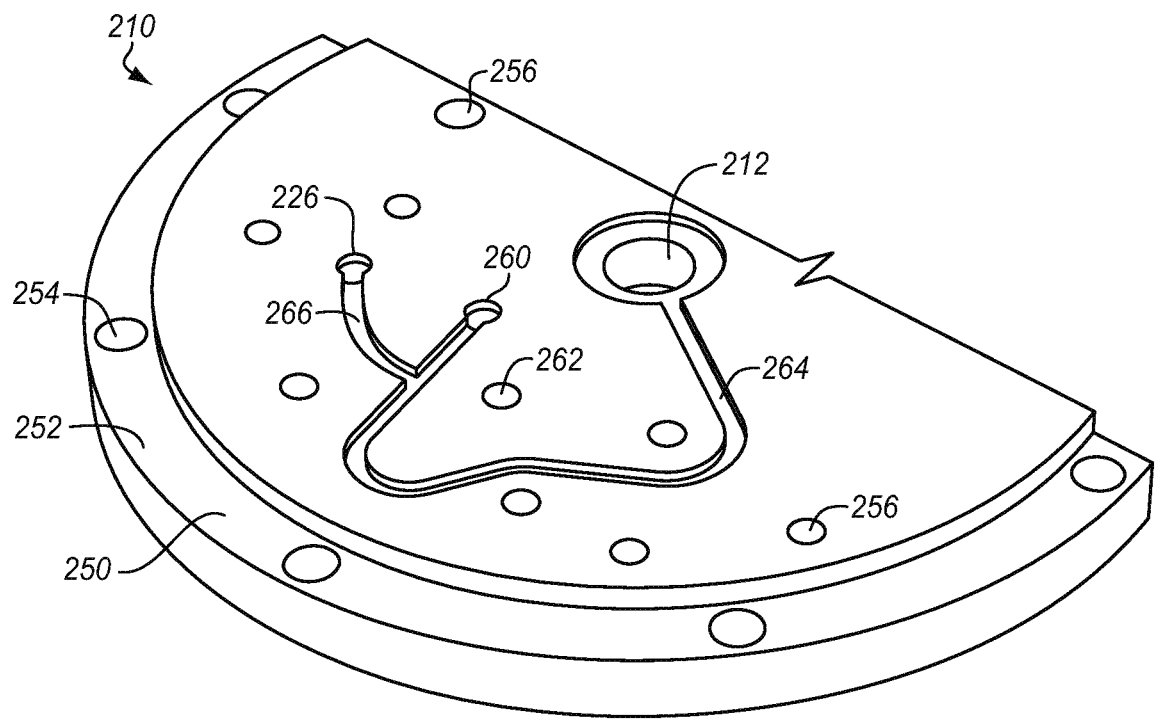
FIG. 2 is an isometric top view of a portion of a base plate of an electrostatic chuck accordance with an embodiment of the invention.

FIG. 2 is an isometric view of a portion of the base plate 210 from above. The base plate includes an outer rim 252 with bolt holes 254 for attaching the cooling plate. The cooling plate may seat against the outer rim or against another outer surface. In the example of FIG. 1, there is an O-ring 224 in the cooling plate that seats against the base plate near the edge. The base plate has an opening for the central shaft 212 through which electrical, and fluid conduits pass to connect with components of the cooling and top plates. There may also be other holes 256, 262 through which other components and fittings may pass, such as temperature probes, separate wiring devices, attachment screws, etc.

The base plate is fitted with a fitting on its bottom surface to receive a dry gas under pressure. The base plate has an opening or outlet 260 on the top surface through which the dry gas exits to the small gap 228 between the base plate and the cooling plate. A low pressure from the gas source 181 forces the dry gas into this gap. From the outlet 260, the dry gas is able to spread and fill the small gap. The dry gas is constrained by the seal 224 around the edge of the base plate and continued flow of gas into the gap will force the gas into any accessible cavities in the small gap and any other cavities in the chuck.

With continued dry gas flow, the dry gas will eventually flow out of the chuck through the central shaft 212. The central shaft contains coolant tubes, wiring, and other conduits but is not sealed so that there are spaces between the different components within the central shaft. These spaces permit the dry gas to flow up and down through the shaft. In other applications, there may be gas conduits specifically fabricated in the central shaft or in other locations to allow the dry gas to flow out of the chuck. In the illustrated example, breathing tubes 226 perform this function. However, since the central shaft permits the gas to flow more freely, more of the gas flows out of the chuck through the central shaft than through the breather tubes. In this way, the dry gas pushes the moist ambient air out of the chuck and reduces any condensation inside the chuck.

The flow of the dry gas may be affected by selecting the position of the outlet 260 and also by shaping the top surface of the base plate. The top surface of the base plate is the surface that is facing the cooling plate. Grooves 264 may be formed in this top surface of the base plate to encourage, lead, or guide dry gas flow in particular directions. The dry gas flows between the base plate and the cooling plate. Because the dry gas exits the outlet with a particular pressure, the dry gas will have a higher flow along paths with the least resistance. Grooves and other surfacing may be used to reduce resistance along any desired path. This leads the dry gas in the intended direction. The grooves may be machined into the base plate or they may be molded, cast, or formed in any of a variety of other ways.

The grooves of FIG. 2 are connected to the dry gas outlet 260 and lead the dry gas toward the outer edge of the base plate near the rim in a circular path. From the edge, the groove guides gas flow back to the central shaft 212. This curved path tends to draw the gas toward the edge and back and encourages flow from the outlet. The dry gas is not contained in the groove but flows in and out of the groove to the small gap between the plates. The groove also includes a spur 266. This spur leads from the main curved path of the groove to the breather tube 226 in a different direction from the main path. The spur allows the dry gas to flow more easily to the breather tube. The breather tube as shown in FIG. 1 leads the dry gas up to the small gap 230 between the cooling plate and the top plate. The breather tube also leads the dry gas to the bottom of the base plate and out of the chamber.

A similar approach may be used to form grooves between the cooling plate and the top plate. The grooves may be on the top surface of the cooling plate or on the bottom surface of the top plate. Similarly, grooves similar to those shown in FIG. 2 may be formed on the opposite surface in the narrow gap. In other words, instead of forming grooves on the top surface of the base plate, the grooves may instead be formed on the bottom surface of the cooling plate. A combined pattern of grooves, some on the base plate and some on the cooling plate may also be used.

Figure 3:
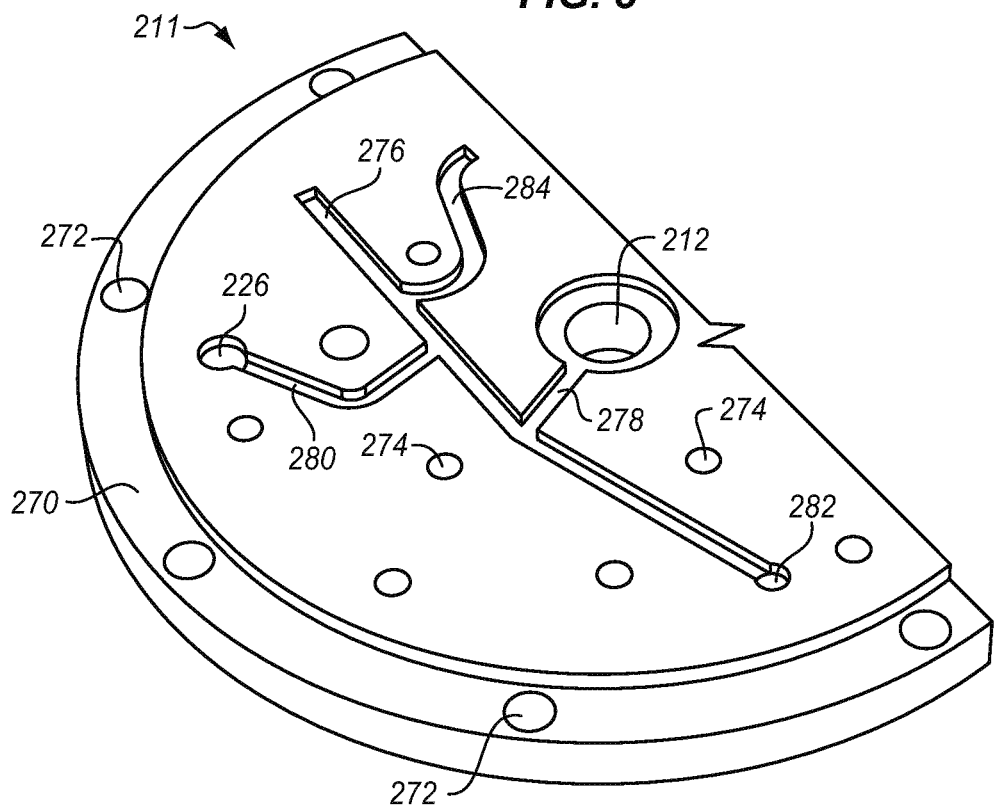
FIG. 3 is an isometric top view of a portion of an alternative base plate of an electrostatic chuck in accordance with an embodiment of the invention.

FIG. 3 is an isometric view of a portion of an alternative base plate or another portion of the same base plate from above. The base plate 211 has an outer rim 270 with a series of attachment fittings 272 to allow the base plate to be attached to other plates and equipment. The base plate has various holes and openings 274 for other connections and fittings.

There is a straight groove 276 in the top of the base plate that connects to a dry gas outlet 282. The straight groove has different segments 276, 278, 280 that allow it to connect to different points on the top plate and to guide the dry gas to different locations across the surface of the top plate. There is a path 278 to the central shaft 212, and a path to the breather tube 226, among others. The straight path of these grooves present less resistance to flow than the curved path of the grooves described above. There is also a curved spur 284 extending from and connecting to a straight segment 276. The curved segment leads the dry gas to an area for which more dry gas is desired. This shows the combination of a curved path and a straight path for grooves on the same surface.

More or less of the top surface of the base plate may have grooves. There may be more or fewer grooves and the paths of the grooves may be selected to suit different purposes. Curved grooves and straight grooves may be combined or used for different locations on the top plate. The depth and width of the grooves may be adapted to provide the desired flow rate along the path of the groove. For a gap between the plates that is on the order of few millimeters, a groove that is 1-10 mm wide and 1-10 mm deep induces a noticeable amount of flow along and in the groove. The depth may be increased to provide a greater flow volume and the width may be increased to provide a greater flow velocity.

Figure 4:
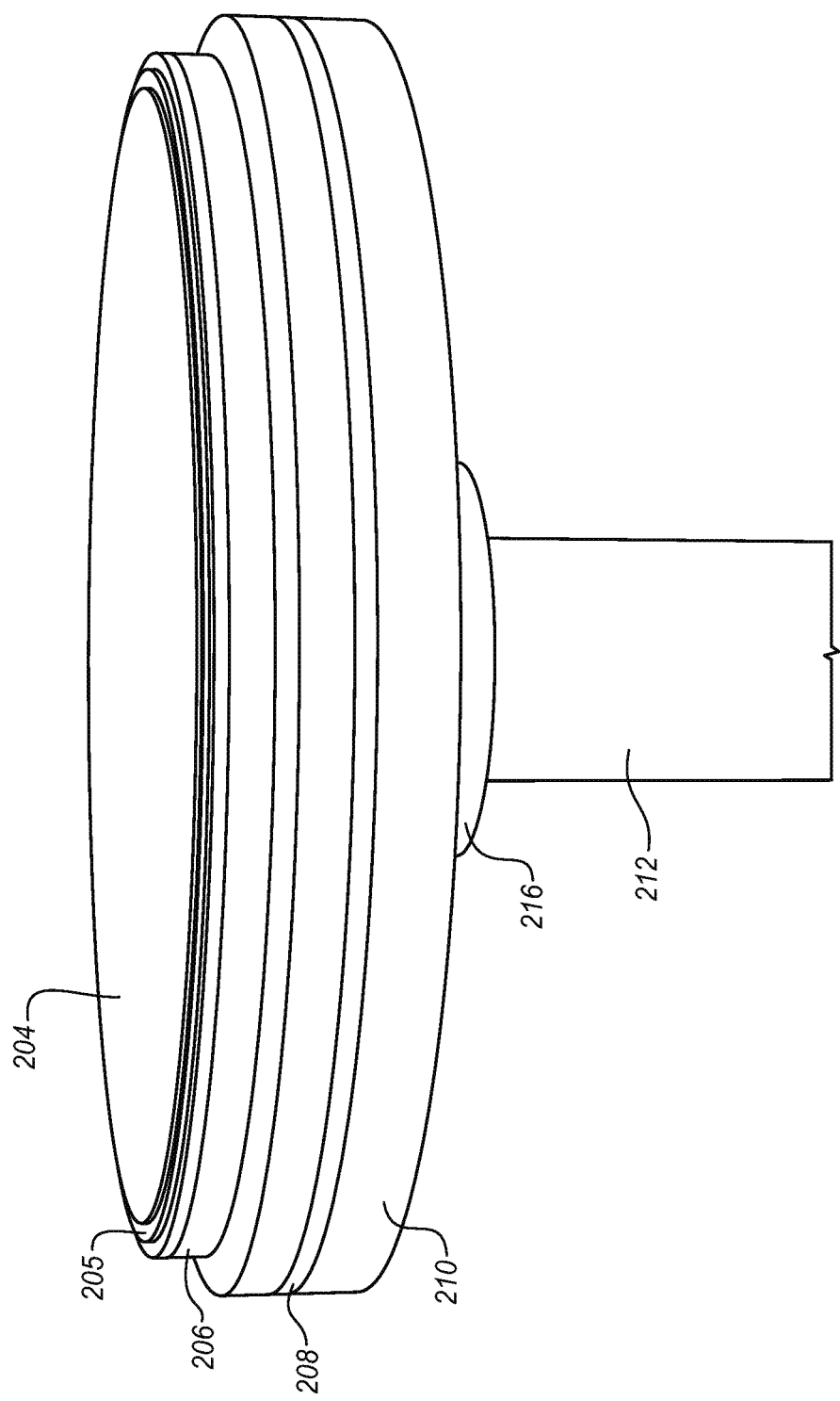
FIG. 4 is an isometric bottom view of a heating plate of a pedestal in accordance with an embodiment of the invention.
Figure 5:
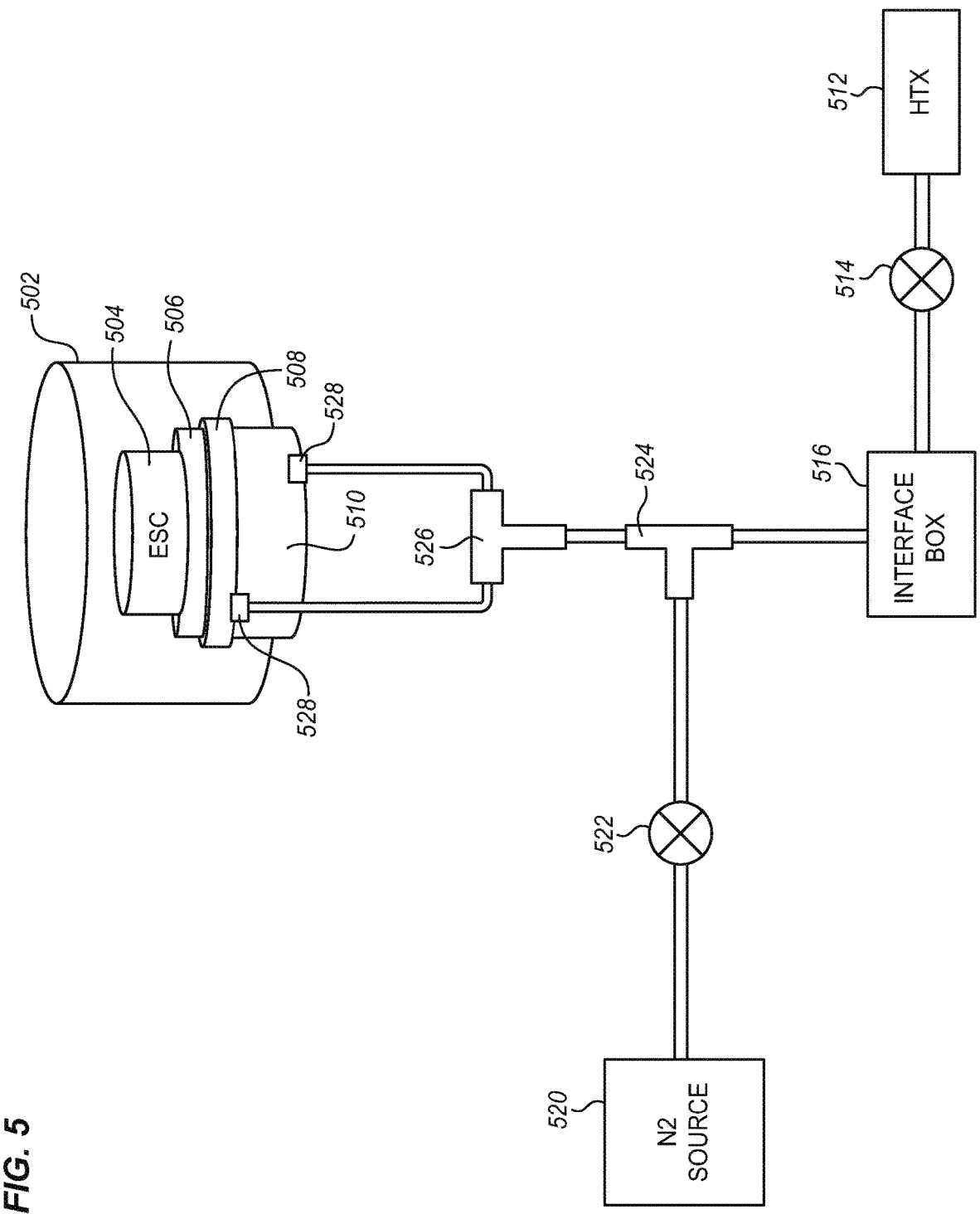
FIG. 5 is a diagram of an dry gas delivery system for an electrostatic chuck in accordance with an embodiment of the invention.

FIG. 4 is an isometric view of the assembled ESC of FIG. 5. The support shaft 212 supports the base plate 210 through a thermal isolator 216. The cooling plate 208 and heater plate 206 are carried by the base plate. The top heater plate 206 carries the puck 204 on the top surface 205 of the heater plate. A workpiece (not shown) is in turn carried above the puck and may be attached electrostatically or in another way.

The primary support shaft 212 supports the base plate 210 with an isolated thermal break 216 between the support shaft and the base plate. The shaft is hollow inside and includes conduits for conductors, gases and other materials that are supplied to the top of the chuck. The base plate supports the cooling plate 208. The cooling plate is typically machined from aluminum and then covered with elastomer caps for each of the cooling channels.

The cooling plate absorbs heat from the workpiece through the dielectric puck 204 and the top plate. It also absorbs heat from the top plate heaters. The top surface 205 of the top plate 206 is bonded to the dielectric puck 204 with a high temperature adhesive, such as silicone. The puck is typically ceramic but may alternatively be made with other materials. In the case of an electrostatic chuck, electrodes (not shown) are embedded within the puck to generate an electrostatic field with which to grip a workpiece, such as a silicon substrate.

The base plate 210 provides a structural reinforcement to the cooling plate 208. The base plate may be formed from a rigid material that has poor thermal conductivity or a lower thermal conductivity compared to the cooling plate. This prevents heat flow between cooling channels through the base plate. The base plate may be formed from polystyrene, titanium, alumina, ceramic, stainless steel, nickel, and similar materials. It may be formed of a single piece or several parts brazed together. The base plate may be bolted, screwed or riveted to the cooling plate, depending on the particular implementation.

The base plate 210 is carried on a shaft 212. The shaft is hollow inside and includes conduits for conductors, gases and other materials that are supplied to the top of the chuck. An isolator 216 is placed between the metal shaft and the metal base plate 210 to reduce the conduction of heat between the shaft and the base plate. This keeps the shaft cooler and also shields heat from any handling mechanism that may be attached to the shaft.

FIG. 5 is a schematic diagram of a dry gas supply system and an alternative workpiece support. A cold air processing chamber 502, has a workpiece support 504 mounted near the bottom of the chamber. The workpiece support may be an electrostatic chuck to support a silicon wafer or another support such as a pedestal or other carrier for other workpieces made of other materials, such as gallium arsenide, lithium niobate, ceramic and other materials.

The chuck 504 is supported by a dielectric plate 506 which is attached to a cathode plate 508. A shroud or cover 510 is mounted to the bottom of the cathode to protect and cover the fittings and attachments of the cathode. These attachments include two nitrogen gas ($N_2$) inlet fittings 528. An $N_2$ source 520 provides a dry gas, such as $N_2$ under pressure to a control valve 522. The gas flows from the source to the control valve and then to a first distributor 524, such as a tee, through another second distributor, such as another tee 526 to the two dry gas attachment fittings 528 of the cathode. The fitting connect through the cathode to the base plate 506 as shown and described above.

The dry gas may also be provided from the first distributor 524 to any other desired components. In the illustrated example, the first distributor is coupled to an interface box 516 which serves as an interface to heat exchanger 512 and control valve 514. In such an example the dry gas serves as a purge gas for the chuck and also for the interface box. This reduces condensation in both areas. The dry gas may be provided to other components as may be desired for a particular hardware configuration.

FIG. 6 is a schematic of a plasma etch system 100 including a chuck assembly 142 in accordance with an embodiment of the present invention. The plasma etch system 100 may be any type of high performance etch chamber known in the art, such as, but not limited to, Enabler®, DPS IT®, AdvantEdge™ G3, EMAX®, Axiom®, or Mesa™ chambers, all of which are manufactured by Applied Materials of California, USA. Other commercially available etch chambers may similarly utilize the chuck assemblies described herein. While the exemplary embodiments are described in the context of the plasma etch system 100, the chuck assembly described herein is also adaptable to other processing systems used to perform any plasma fabrication process (e.g., plasma deposition systems, etc.)

Referring to FIG. 6, the plasma etch system 100 includes a grounded chamber 105. Process gases are supplied from gas source(s) 129 connected to the chamber through a mass flow controller 149 to the interior of the chamber 105. Chamber 105 is evacuated via an exhaust valve 151 connected to a high capacity vacuum pump stack 155. When plasma power is applied to the chamber 105, a plasma is formed in a processing region over a workpiece 110. A plasma bias power 125 is coupled into the chuck assembly 142 to energize the plasma. The plasma bias power 125 typically has a low frequency between about 2 MHz to 60 MHz, and may be, for example, in the 13.56 MHz band. In an example embodiment, the plasma etch system 100 includes a second plasma bias power 126 operating at about the 2 MHz band which is connected to an RF (Radio Frequency) match 127. The plasma bias power 125 is also coupled to the RF match and also coupled to a lower electrode via a power conduit to supply the drive current 128. A plasma source power 130 is coupled through another match (not shown) to a plasma generating element 135 to provide high frequency source power to inductively or capacitively energize the plasma. The plasma source power 130 may have a higher frequency than the plasma bias power 125, such as between 100 and 180 MHz, and may, for example, be in the 162 MHz band.

A workpiece 110 is loaded through an opening 115 and clamped to the chuck assembly 142 inside the chamber. The workpiece 110, such as a semiconductor wafer, may be any wafer, substrate, or other workpiece employed in the semiconductor processing art and the present invention is not limited in this respect. The workpiece 110 is disposed on a top surface of a dielectric layer or puck of the chuck assembly that is disposed over a cooling base assembly 144 of the chuck assembly. A clamp electrode (not shown) is embedded in the dielectric layer. In particular embodiments, the chuck assembly 142 includes electrical heaters (not shown). The heaters may be independently controllable to the same or to different temperature set points.

A system controller 170 is coupled to a variety of different systems to control a fabrication process in the chamber. The controller 170 may include a temperature controller 175 to execute temperature control algorithms (e.g., temperature feedback control) and may be either software or hardware or a combination of both software and hardware. The temperature controller receives temperature information from a thermal sensor 143 in the chuck and then adjusts the heaters and heat exchangers accordingly. While only one thermal sensor is shown, there may be many more in many different locations, depending on the particular implementation. The system controller 170 also includes a central processing unit 172, memory 173 and input/output interface 174. The temperature controller 175 is to output control signals or drive current 128 to the heaters affecting the rate of heating and therefore the rate of heat transfer between each heater zone of the chuck assembly 142 and the workpiece In embodiments, in addition to the heaters, there may be one or more coolant temperature zones. The coolant zones have heat transfer fluid loops with flow control that is controlled based on a temperature feedback loop. In the example embodiment, the temperature controller 175 is coupled through a control line 176 to a heat exchanger (HTX)/chiller 177 depending on the particular implementation. The control line may be used to allow the temperature controller to set a temperature, flow rate, and other parameters of the heat exchanger. The flow rate of the heat transfer fluid or coolant through conduits in the chuck assembly 142 may alternatively or additionally be controlled by the heat exchanger.

One or more valves 185 (or other flow control devices) between the heat exchanger/chiller 177 and fluid conduits in the chuck assembly 142 may be controlled by the temperature controller 175 to independently control a rate of flow of the heat transfer fluid. The temperature controller may also control the temperature set point used by the heat exchanger to cool the heat transfer fluid.

The heat transfer fluid may be a liquid, such as, but not limited to deionized water/ethylene glycol, a fluorinated coolant such as Fluorinert® from 3M or Galden® from Solvay Solexis, Inc. or any other suitable dielectric fluids such as those containing perfluorinated inert polyethers. While the present description describes a vacuum chuck in the context of a plasma processing chamber, the principle, structures, and techniques described herein may be used with a variety of different workpiece supports, in a variety of different chambers and for a variety of different processes.

The processing system 100 also includes dry gas source 181 that is coupled through a control valve 182 to the chuck assembly 142 as shown, for example in FIG. 5. The dry gas source may be a source of $N_2$ or any other suitable gas to purge moisture out of the chuck. The dry gas source may also be coupled to other components to purge gas out of the other components. As described, the gas is supplied to the chuck but is not allowed to enter the chamber. A separate source of reactive gases 129 is provided to support the fabrication processes being applied to the workpiece 110.

The dry gas source may be used to support other processes, depending on the particular implementation.

In operation, a workpiece is moved through the opening of the chamber and attached to the puck of the carrier for fabrication processes. Any of a variety of different fabrication process may be applied to the workpiece while it is in the processing chamber and attached to the carrier. During the process and optionally before the process, the dry gas is supplied under pressure to the dry gas outlet of the base plate. The pressure pushes the dry gas into the space between the base plate and the cooling plate. The gas flow drives the ambient air from between the base plate and the cooling plate.

In summary by applying a positive pressure to the dry gas outlet, the dry gas and any other gas within the carrier is pushed to exit through outlets of the carrier. There are outlets in the central shaft and in breather tubes. There may also be other outlets, depending on the particular design of the carrier. So for example supplying the dry gas drives the dry gas through the central shaft between the base plate and the cooling plate and from between the base plate and the cooling plate through the central shaft to exit the carrier. The grooves also lead the supplied dry gas to the central shaft and to any other intended area of the carrier until the pressure drives the dry purge gas to push out across the base plate so that the dry gas exits through the central shaft and any available openings.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicate that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An apparatus comprising:
    a puck to carry a workpiece for fabrication processes;
    a top plate thermally coupled to the puck;
    a cooling plate fastened to and thermally coupled to the top plate;
    a base plate fastened to the cooling plate opposite the puck;
    and a dry gas outlet of the base plate to supply a dry gas under pressure to a space between the base plate and the cooling plate, the dry gas outlet positioned between a central shaft and a periphery of the base plate,
    wherein the base plate has a groove configured to allow the dry gas to flow in and out of the groove to the space between the base plate and the cooling plate, the groove having a path from the dry gas outlet to the central shaft, wherein a portion of the path is from the periphery of the base plate to the central shaft; and
    a cylindrical bore through the cooling plate to allow the dry gas to flow between the base plate and the cooling plate to between the cooling plate and the top plate, the cylindrical bore being positioned so that the groove leads the dry gas to flow to the cylindrical bore.

2. The apparatus of claim 1, wherein the dry gas is nitrogen.

3. The apparatus of claim 1, wherein the central shaft is disposed through the base plate, and the cooling plate supports the base plate wherein the central shaft permits gas flow between the base plate and the cooling plate and wherein the dry gas exits from between the base plate and the cooling plate through the central shaft.

4. The apparatus of claim 1, wherein the groove is formed in a top surface of the base plate facing the cooling plate, the groove to guide flow of the dry gas from the dry gas outlet.

5. The apparatus of claim 4, wherein the groove leads to the central shaft through the base plate so that the dry gas exits through the central shaft.

6. The apparatus of claim 1, wherein the groove has a spur to guide flow in a second direction.

7. The apparatus of claim 1, wherein the base plate is formed of a material with lower thermal conductivity than the cooling plate.

8. The apparatus of claim 7, wherein the material is a thermoset polystyrene.

9. A plasma processing system comprising:
    a plasma chamber;
    a plasma source to generate a plasma containing gas ions in the plasma chamber; and
    a workpiece holder in the chamber having a puck to carry the workpiece for fabrication processes, a top plate thermally coupled to the puck, a cooling plate fastened to and thermally coupled to the top plate, a base plate fastened to the cooling plate opposite the puck, a dry gas outlet of the cooling plate positioned between a central shaft and a periphery of the base plate, the dry gas outlet to supply a dry gas under pressure to a space between the base plate and the cooling plate, wherein the base plate has a groove configured to allow the dry gas to flow in and out of the groove to the space between the base plate and the cooling plate, the groove having a path from the dry gas outlet to the central shaft, wherein a portion of the path is from the periphery of the base plate to the central shaft, and a cylindrical bore through the cooling plate to allow the dry gas to flow between the base plate and the cooling plate to between the cooling plate and the top plate, the cylindrical bore being positioned so that the groove leads the dry gas to flow to the cylindrical bore.

10. The system of claim 9, wherein the central shaft is coupled to a space between the cooling plate and the top plate.

11. A method comprising:
attaching a workpiece to a puck of a carrier to carry the workpiece for fabrication processes, the carrier including a top plate thermally coupled to the puck, a cooling plate fastened to and thermally coupled to the top plate, and a base plate fastened to the cooling plate opposite the puck;
applying a fabrication process to the workpiece in a processing chamber while the workpiece is attached to the carrier; and
supplying a dry gas under pressure to an outlet of the base plate positioned between a central shaft and a periphery of the base plate during the fabrication process, the outlet to supply the dry gas under pressure to a space between the base plate and the cooling plate, wherein the base plate has a groove configured to allow the dry gas to flow in and out of the groove to the space between the base plate and the cooling plate, the groove having a path from the outlet to the central shaft, wherein a portion of the path is from the periphery of the base plate to the central shaft, and a cylindrical bore through the cooling plate to allow the dry gas to flow between the base plate and the cooling plate to between the cooling plate and the top plate, the cylindrical bore being positioned so that the groove leads the dry gas to flow to the cylindrical bore.

12. The method of claim 11, wherein the central shaft is disposed through the base plate and the cooling plate to support the base plate wherein supplying the dry gas drives the dry gas through the central shaft between the base plate and the cooling plate and from between the base plate and the cooling plate through the central shaft to exit the carrier.

13. The method of claim 12, wherein the groove leads the supplied dry gas to the central shaft through the base plate so that the dry gas exits through the central shaft.

* * * * *